United States Patent
Hiroshige et al.

(10) Patent No.: US 7,527,753 B2
(45) Date of Patent: May 5, 2009

(54) ACRYLIC-BASED THERMALLY CONDUCTIVE COMPOSITION AND THERMALLY CONDUCTIVE SHEET

(75) Inventors: Yuji Hiroshige, Sagamihara (JP); Yoshinao Yamazaki, Sagamihara (JP)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 10/551,593

(22) PCT Filed: Mar. 19, 2004

(86) PCT No.: PCT/US2004/008522

§ 371 (c)(1), (2), (4) Date: Sep. 30, 2005

(87) PCT Pub. No.: WO2004/094529

PCT Pub. Date: Nov. 4, 2004

(65) Prior Publication Data

US 2006/0249714 A1 Nov. 9, 2006

(30) Foreign Application Priority Data

Apr. 16, 2003 (JP) ............................. 2003-111743

(51) Int. Cl.
*H01B 1/02* (2006.01)
*C08L 33/06* (2006.01)

(52) U.S. Cl. .............. 252/518.1; 252/519.5; 252/520.2; 252/521.3; 252/500; 524/560; 428/355 R; 428/355 EN; 428/355 AC

(58) Field of Classification Search ................ 252/511, 252/518.1, 519.5, 520.2, 521.3, 500; 524/560; 428/355 R, 355 EN, 355 AC
See application file for complete search history.

(56) References Cited

U.S. PATENT DOCUMENTS

| | | | | |
|---|---|---|---|---|
| 3,167,525 A | * | 1/1965 | Thomas | 523/300 |
| 3,701,758 A | * | 10/1972 | Maska | 526/298 |
| 4,275,180 A | * | 6/1981 | Clarke | 525/173 |
| 4,576,993 A | * | 3/1986 | Tamplin et al. | 525/240 |
| 4,654,255 A | * | 3/1987 | Kojima et al. | 442/149 |
| 4,886,689 A | * | 12/1989 | Kotliar et al. | 428/35.7 |
| 5,242,777 A | * | 9/1993 | Kato et al. | 430/109.5 |
| 5,336,443 A | * | 8/1994 | Odashima | 252/511 |
| 5,387,450 A | * | 2/1995 | Stewart | 428/40.4 |
| 5,412,035 A | * | 5/1995 | Schmitt et al. | 525/93 |
| 5,470,622 A | * | 11/1995 | Rinde et al. | 428/34.9 |
| 5,552,451 A | * | 9/1996 | Everaerts et al. | 522/46 |
| 5,840,783 A | * | 11/1998 | Momchilovich et al. | 522/112 |
| 6,080,480 A | * | 6/2000 | Shiba et al. | 428/355 R |
| 6,126,865 A | * | 10/2000 | Haak et al. | 252/512 |
| 6,399,209 B1 | | 6/2002 | Misra et al. | |
| 6,660,354 B2 | | 12/2003 | Suwa et al. | |
| 6,720,387 B1 | * | 4/2004 | Stark et al. | 525/203 |
| 6,841,612 B1 | * | 1/2005 | Yang et al. | 524/523 |
| 7,008,680 B2 | | 3/2006 | Everaerts et al. | |
| 2001/0008689 A1 | | 7/2001 | Muta et al. | |
| 2002/0193474 A1 | * | 12/2002 | Daily et al. | 524/109 |
| 2003/0060538 A1 | | 3/2003 | Norris et al. | |
| 2003/0175512 A1 | | 9/2003 | Ishiguro et al. | |

FOREIGN PATENT DOCUMENTS

| | | | |
|---|---|---|---|
| EP | 0 429 027 A1 | | 5/1991 |
| EP | 0989143 A1 | * | 3/2000 |
| EP | 1698664 | * | 9/2006 |
| JP | 05-117309 | | 5/1993 |
| JP | 2000-198870 | | 7/2000 |
| JP | 2000509209 | | 7/2000 |
| JP | 2000-313785 | | 11/2000 |
| JP | 2000336279 | | 12/2000 |
| JP | 2001089756 | | 4/2001 |
| JP | 2002-128931 | | 5/2002 |
| JP | 2002-322447 | | 8/2002 |
| JP | 2002234952 | | 8/2002 |
| JP | 2002-308919 | * | 10/2002 |
| JP | 2003-048285 | | 2/2003 |
| JP | 2003105299 | | 4/2003 |
| JP | 2004 059851 | | 2/2004 |
| WO | WO 01/76855 | | 10/2001 |

* cited by examiner

*Primary Examiner*—Douglas Mc Ginty
*Assistant Examiner*—Jaison P Thomas
(74) *Attorney, Agent, or Firm*—Dean M. Harts; Stephen F. Wolf

(57) ABSTRACT

Provided is a thermally conductive composition which shows a low thermal resistance, and good releasability after service. For example, one composition includes an acrylic-based thermally conductive composition comprising a binder component containing a crystalline acrylic polymer with an alkyl group of 18 carbons or more and a thermally conductive filler.

9 Claims, No Drawings

ACRYLIC-BASED THERMALLY CONDUCTIVE COMPOSITION AND THERMALLY CONDUCTIVE SHEET

TECHNICAL FIELD

The present invention relates to an acrylic-based thermally conductive composition and to a thermally conductive sheet.

BACKGROUND

Radiating release of heat generated by various electronic and electrical devices such as personal computers is a matter of major importance. Thermally conductive compositions and thermally conductive sheets obtained therefrom are used as heat radiating means to allow heat from heat generating parts of electronic and electric devices to escape to heat radiating parts such as heat sinks and metal covers. They are also used for anchoring between electronic parts and heat radiating parts.

Because the thermally conductive sheet is used while being sandwiched between a heat generating part and a heat radiating part, the contacts at the interfaces between the sheet and those parts are important in view of the thermal conductivity. That is, when the contacts at the interfaces are not good, the thermal resistance between the parts and the sheet increases and thermal conductivity becomes lower. Accordingly, the heat conductive sheet must be contacted with a heat generating part and a heat radiating part while the sheet is conforming to fine irregularities present on the surfaces of the parts. The thermally conductive sheet is therefore required to have flexibility and adhesion to the heat generating part and the heat radiating part. However, a thermally conductive sheet with high adhesion generally shows poor handling and is difficult to be released after service.

Japanese Unexamined Patent Publication (Kokai) No. 2000-336279 discloses a thermally conductive composition and a thermally conductive sheet in which wax such as paraffin wax or softening agents, tackifiers and thermally conductive, fillers are added to a thermoplastic resin. Addition of wax to the composition improves adhesion to a body to which the sheet is applied. However, release of the sheet from the body becomes difficult after service. Oil is specifically used as a softening agent. However, volatilization of the oil decreases the flexibility of the composition and adhesion of the sheet to the body, or may cause contamination of electronic parts.

Japanese National Patent Publication (Kohyo) No. 2000-509209 discloses a thermally conductive composition comprising an acrylic pressure-sensitive adhesive component, an α-olefin thermoplastic component, paraffin wax and thermally conductive fillers. Because wax is used, thermally conductive sheets formed from the composition are difficult to be released after service similarly to the composition described in Patent Publication 336279 mentioned above. Although the composition contains an α-olefin thermoplastic component and an acrylic pressure-sensitive adhesive component, adhesion of the sheets to a body to which the sheets are applied becomes insufficient due to an insignificant decrease in viscosity during heating, and the thermal conductivity is lowered.

Japanese Unexamined Patent Publication (Kokai) No. 2001-89756 discloses thermally intermediating materials comprising polymer components, melting point components such as wax or wax-like compounds and thermally conductive fillers. Thermally conductive sheets formed from these compositions are difficult to be released after service similarly to the composition described in Patent Publication 336279. Moreover, the melting point components and polymer components must be selected while the compatibility of these components are taken into consideration, and therefore a flexibility in selections of materials are restricted.

Specification of U.S. Pat. No. 6,399,209 discloses a thermally conductive pad containing a laminate that comprises a flexible layer containing polysiloxane wax having alkyl group substituents and conductive fillers and an anti-blocking layer. A polyester having a glass transition temperature of 70° C. or higher is used as the anti-blocking layer. As a result, the pad is excellent in releasability after service; however, the thermal resistance at the interface is increased due to the high melt viscosity.

Japanese Unexamined Patent Publication (Kokai) No. 2002-234952 discloses heat-release sheets composed of a composition containing a polymer gel (A), a compound (B) that is solid or paste at room temperature and becomes liquid when heated and a thermally conductive filler (C). Specifically, examples of the compound (B) include silicone oils, wax and α-olefins. For such materials, handling of the sheets during releasing is poor, and the thermal conductivity of the sheets are not good because adhesion of the sheets to bodies to which the sheets are applied is decreased due to volatilization of the materials during service of the sheets; moreover, the materials cause contamination of the bodies.

SUMMARY

It is therefore an object of the present invention to provide a thermally conductive composition and a thermally conductive sheet having low thermal resistances and showing good releasability after service.

According to one embodiment of the present invention, there is provided an acrylic-based thermally conductive composition comprising a binder component containing a crystalline acrylic polymer with an alkyl group of 18 carbons or more and a thermally conductive filler.

Such a thermally conductive composition has high adhesion to a body with which the composition is contacted during service to decrease the thermal resistance, and as a result the composition has high thermal conductivity. However, the composition shows good releasability after service.

In addition, the term "crystalline acrylic polymer" used in the present specification means an acrylic polymer that shows a melting peak when measured by differential scanning calorimetry (DSC) while heated at a rate of 5° C./min and that is obtained from monomers containing an acrylic and/or methacrylic monomer.

Moreover, the term "crystalline acrylic monomer" means that the homopolymer of which becomes a crystalline acrylic polymer.

The term "noncrystalline acrylic polymer" means an acrylic polymer other than a crystalline acrylic polymer.

The term "noncrystalline acrylic monomer" means that the homopolymer of which becomes a noncrystalline acrylic polymer.

DETAILS OF PRESENTLY PREFERRED EMBODIMENTS

Binder Component

A crystalline acrylic polymer is used as the binder component of the thermally conductive composition of the present invention. The crystalline acrylic polymer composing the binder component therefore shows a melting point. The binder component is melted at temperature higher than the melting point of the crystalline acrylic polymer to improve adhesion to a body with which the composition is contacted. As a result, the heat resistance at the interface between the body and the composition is lowered, and the composition exhibits high thermal conductivity. On the other hand, when the composition after service is cooled to temperature lower than the melting point of the crystalline acrylic polymer, the crystalline acrylic polymer is solidified to facilitate release of the sheet. Accordingly, the crystalline acrylic polymer contained in the binder component should be made to have a melting point lower than the temperatures to which the polymer is exposed during the service of the thermally conductive composition. The crystalline acrylic polymer preferably has a melting point higher than room temperature (e.g., 25° C. or higher) and 100° C. or lower, more preferably 30° C. or higher and 60° C. or lower.

The crystalline acrylic polymer is a polymer of a crystalline acrylic monomer, and may be either a homopolymer or copolymer. The crystalline acrylic monomer includes a (meth)acrylate ester monomer with an alkyl group of 18 carbons or more. Examples of the crystalline acrylic monomer include octadecyl (meth)acrylate, (also termed "stearyl (meth)acrylate"), nonadecyl (meth)acrylate, icosanyl (meth)acrylate, henicosanyl (meth)acrylate, docosanyl (meth)acrylate (also termed "behenyl (meth)acrylate"), tricosanyl (meth)acrylate, tetracosanyl (meth)acrylate and octyldodecyl (meth)acrylate. The crystalline acrylic monomer is obtained by, for example, polymerizing one of the above monomers, or a mixture of two monomers or more of the above monomers. Moreover, the crystalline acrylic polymer can also be obtained from a crystalline macromonomer that is synthesized from one of the above monomers. Such a crystalline macromonomer is an oligomer prepared from a crystalline acrylic monomer and having a polymerizing functional group such as a terminal (meth)acryloyl group. Specifically, an octadecyl (meth)acrylate oligomer having a (meth)acryloyl terminal group can be mentioned as the crystalline macromonomer.

Furthermore, the crystalline acrylic polymer may also be a copolymer of a crystalline acrylic monomer and a noncrystalline acrylic monomer. For example, the crystalline acrylic polymer is a copolymer of a crystalline (meth)acrylate ester monomer with an alkyl group of 18 carbons or more and a noncrystalline acrylic monomer. The noncrystalline acrylic monomer is, for example, a (meth)acrylic monomer with an alkyl group of 12 carbons or less. In more detail, examples of the noncrystalline acrylic monomer include ethyl (meth)acrylate, butyl (meth)acrylate, hexyl (meth)acrylate, 2-ethylhexyl (meth)acrylate, octyl (meth)acrylate, isooctyl (meth)acrylate, decyl (meth)acrylate and dodecyl (meth)acrylate. Moreover, to increase cohesion of the resulting thermally conductive composition, a (meth)acrylic monomer with a homopolymer glass transition temperature of 20° C. or higher may also be used additionally. As such monomers there may be mentioned carboxyl acids and their corresponding anhydrides, such as acrylic acid and its anhydride, methacrylic acid and its anhydride, itaconic acid and its anhydride, and maleic acid and its anhydride. Other examples of (meth)acrylic monomers with homopolymer glass transition temperatures of 20° C. or higher include cyanoalkyl (meth)acrylates, acrylamide, substituted acrylamides such as N,N'-dimethylacrylamide, and polar nitrogen-containing materials such as N-vinylpyrrolidone, N-vinylcaprolactam, N-vinylpiperidine and acrylonitrile. Other monomers include tricyclodecyl (meth)acrylate, isobornyl (meth)acrylate, hydroxy (meth)acrylate and vinyl chloride. In addition, when the crystalline acrylic polymer is a copolymer of a crystalline acrylic monomer and a noncrystalline acrylic monomer, the crystalline acrylic polymer is a copolymer prepared from a monomer mixture containing preferably 30% by weight or more, more preferably 50% by weight or more of a crystalline acrylic monomer based on the monomer weight so that the crystalline acrylic polymer has sufficient crystallinity.

The binder component may include other polymer components other than the crystalline acrylic polymer as long as the effects of the present invention are not marred. Examples of the other polymer components include a noncrystalline acrylic polymer. The binder component in this case is a mixture of a crystalline acrylic polymer and a noncrystalline acrylic polymer. The noncrystalline acrylic polymer is obtained by polymerizing the above noncrystalline acrylic monomer. In order for the composition to have a high adhesion to a body with which the composition is contacted during service and to show sufficient releasability during cooling the body after service, the binder component preferably contains 10% by weight or more, more preferably 30% by weight or more, and still more preferably 50% by weight or more of the crystalline acrylic polymer based on the weight of the binder component.

Thermally Conductive Filler

The acrylic-based thermally conductive composition of the present invention contains a thermally conductive filler. As thermally conductive fillers there may be used ceramics, metal oxides, metal hydroxides, metal and the like. Specifically, there may be mentioned thermally conductive fillers such as aluminum oxide, silicon oxide, magnesium oxide, zinc oxide, titanium oxide, zirconium oxide, iron oxides, aluminum hydroxide, silicon carbide, boron nitride, aluminum nitride, titanium nitride, silicon nitride, titanium boride, carbon black, carbon fiber, carbon nanotube, diamond, nickel, copper, aluminum, titanium, gold and silver. Crystalline form thereof can be any crystalline form that can be formed by the respective chemical species, such as hexagonal or cubic system. The filler particle size will usually be 500 μm or smaller. If the filler particle size is too large, the sheet strength is reduced. It is preferred to combine a portion of large-sized particles with a portion of small-sized particles. This is because the small particle size portion will fill the space between the large particle size portions, thus increasing the amount of filler that can be loaded. The particle size of the large particle size portion is preferably 10-150 μm, and the particle size of the small particle size portion is below that of the large particle size portion, and preferably less than 10 μm. For improved sheet strength, a filler which has been surface-treated with silane, titanate or the like may be used. In addition, a filler coated thereon with a coating such as water resistant or insulative coat made of ceramics or polymers may be used. In addition, the term "particle size" used here means the dimension of the longest length as measured in a straight line passing through the center of gravity of the filler. The filler shape may be regular or irregular, for example, polygonal, cubic, elliptical, spherical, needle-like, plate-like or flaky, or combination of these shapes. Further, a filler can be a particle formed by aggregating crystalline particles. The filler shape may be selected based on the viscosity of the thermally polymerizing binder component and ease of working the final, polymerized thermally conductive composition.

Further, an electromagnetic wave absorbing filler can be added in order to impart an electromagnetic wave absorbing property. An electromagnetic wave absorbing filler includes soft ferrite compounds such as Ni—Zn ferrite, Mg—Zn ferrite and Mn—Zn ferrite, magnetically soft metals such as carbonyl iron and Fe—Si—Al alloy (sendust), and carbon. Since an electromagnetic wave absorbing filler itself is also thermally conductive, an electromagnetic wave absorbing filler may be used alone, or as a mixture with a thermally conductive filler.

Other Additives

The thermally conductive composition of the invention may also contain additives such as tackifiers, antioxidants, plasticizers, flame retardants, anti-settling agents, thickeners such as acryl rubber and epichlorohydrin rubber, thixotropic agents such as micronized silica powder, surfactants, anti-foaming agents, coloring agents, electric conductive particles, antistatic agents, organic fine particles, ceramic bubbles and the like. Alternatively, combinations of the foregoing additives may also be used.

Production of Acrylic-Based Thermally Conductive Composition and Thermally Conductive Sheet The acrylic-based thermally conductive composition of the present invention can be produced by mixing a (meth)acrylic monomer (including crystalline acrylic monomer) for a polymer composing the binder component and a thermally conductive filler, and then carrying out polymerization. However, because the viscosity of the (meth)acrylic monomer will generally be low without further processing, the filler may settle when a thermally conductive filler is mixed with the (meth)acrylic monomer-containing binder component prior to polymerization. In such cases, it is preferred to partially polymerize the (meth)acrylic monomer beforehand to increase the viscosity. Such partial polymerization is preferably carried out to a viscosity of about 100-10,000 centipoise (cP) in terms of the thermal polymerizing binder component. The partial polymerization may be carried out by any of various methods such as, for example, thermal polymerization, ultraviolet polymerization, electron beam polymerization, γ-ray polymerization and ionizing irradiation.

A thermal polymerization initiator or photopolymerization initiator is commonly used for such partial polymerization. As thermal polymerization initiators there may be used organic peroxide free radical initiators such as diacyl peroxides, peroxyketals, ketone peroxides, hydroperoxides, dialkyl peroxides, peroxy esters, peroxy dicarbonates and the like. Specifically there may be mentioned lauroyl peroxide, benzoyl peroxide, cyclohexanone peroxide, 1,1-bis(t-butylperoxy)-3,3,5-trimethylcyclohexane, t-butylhydroperoxide, bis(4-t-butylcyclohexyl)peroxydicarbonate, 1,1-bis(t-hexylperoxy)-3,3,5-tricyclohexane, 1,1-bis(t-hexylperoxy)cyclohexane, 1,1-bis(t-butylperoxy)cyclohexane, and the like. Alternatively, persulfate/bisulfite combinations may also be used.

As photopolymerization initiators there may be mentioned benzoin ethers such as benzoin ethyl ether or benzoin isopropyl ether, anisoin ethyl ether and anisoin isopropyl ether, Michler's ketone (4,4'-tetramethyldiaminobenzophenone), or substituted acetophenones such as 2,2-dimethoxy-2-phenylacetophenone (for example, KB-1 by Sartomer; Irgacure™ 651 by Ciba-Specialty Chemical) and 2,2-diethoxyacetophenone. In addition there may be mentioned substituted α-ketols such as 2-methyl-2-hydroxypropiophenone, aromatic sulfonyl chlorides such as 2-naphthalenesulfonyl chloride, and photoactive oxime-based compounds such as 1-phenone-1,1-propanedione-2-(o-ethoxycarbonyl)oxime. Any combination of the foregoing thermal polymerization initiators or photopolymerization initiators may also be used.

The amount of the initiator used for partial polymerization is not particularly restricted, but will normally be 0.001-5 parts by weight to 100 parts by weight of the (meth)acrylic monomer.

Furthermore, for the partial polymerization, the partial polymerization can be carried out with a chain transfer agent to control the molecular weight and the content of the polymer included in the obtained partially polymerized polymer. Examples of the chain transfer agent include mercaptans, disulfides, carbon tetrabromide, carbon tetrachloride or the like, and combinations thereof. If used, the transfer agent is generally used in an amount of 0.01-1.0 part by weight based on 100 parts by weight of the (meth)acrylic monomer.

A crosslinking agent may be used to increase the strength of a product when the obtained thermally conductive composition is processed into a sheet form or the like. As the crosslinking agents, crosslinking agents to be thermally activated may also be used. Included in examples of the crosslinking agent are lower alkoxylated aminoformaldehyde condensates with 1-4 carbon atoms in the alkyl group, hexamethoxymethylmelamine (for example, Cymell™ 303 by American Cyanamide), tetramethoxymethylurea (for example, Beetle™ 65 by American Cyanamide) or tetrabutoxymethylurea (Beetle™ 85). Other useful crosslinking agents include polyfunctional acrylates such as 1,6-hexanediol diacrylate and tripropyleneglycol diacrylate. The crosslinking agent will usually be used in an amount of 0.001-5 parts by weight to 100 parts by weight of the monomer. Combinations of the foregoing crosslinking agents may also be used.

A polymerizing mixture (thermally conductive composition precursor) is formed by combining a thickened binder component precursor comprising the (meth)acrylic monomer or a partially polymerized polymer obtained by partial polymerization of the (meth)acrylic monomer, or a mixture of the aforementioned monomer and partially polymerized polymer, and a polymerization initiator, with a thermally conductive filler, and optional crosslinking agents, chain transfer agents or additives. Any of the polymerization methods used for producing the aforementioned partially polymerized polymers may be used. However, thermal polymerization or ultraviolet polymerization is commonly used. The same thermal polymerization initiators or photopolymerization initiators as described in the above partially polymerized polymers may be used for this polymerization. Moreover, two or more polymerization initiators with different half-lives may also be used to form the polymerizing mixture.

When the binder component precursor is to be polymerized by thermal polymerization, the thermally conductive composition of the present invention can be produced by the following procedure. The thermally conductive composition precursor is deaired and mixed by a planetary mixer or the like. The resulting polymerizing mixture can be used as a thermally conductive adhesive by filling the mixture in a liquid state in the location or area between the portions to be adhered and then thermally polymerizing at 50-200° C. Alternatively, the polymerizing mixture is heated at about 50-200° C. for thermal polymerization reaction to give a thermally conductive composition according to the invention. As a (meth)acrylic monomer, a (meth)acrylic monomer having any of acidic, neutral or basic nature in a molecule can be used. Further, a thermally conductive filler having any of acidic, neutral or basic nature can be used. A (meth)acrylic monomer and a thermally conductive filler, when used together, can have either the same nature, or different nature. However, in the thermal polymerization reaction of an acrylic monomer with a peroxide, the presence of reducing metal ions sometimes causes a promotion reaction termed a redox reaction. Attention must therefore be paid when an acidic (meth)acrylic monomer such as acrylic acid is used. That is, a reducing metal ion eluted from a metal mixer, a thermally conductive filler and electromagnetic wave-absorbing filler may cause a redox reaction. This problem can be avoided by lowering a viscosity of the thermally polymerizable binder component by reducing a proportion of the partially polymerized polymer therein. Alternatively, the problem can be avoided by using a mixer made of nonmetallic material or a mixer coated with a resin on its metal surface.

When the binder component precursor is polymerized by ultraviolet polymerization, the thermally conductive composition of the present invention can be produced by the following procedure. The thermally conductive composition precursor is deaerated and mixed with a planetary mixer or the like. The polymerizing mixture thus obtained is molded, and exposed to ultraviolet rays to give the thermally conductive composition provided that the molded body thickness is restricted to ensure an ultraviolet ray transmittance for polymerization. The content of the thermally conductive filler is also restricted for the same reason.

When the thermally conductive sheet of the invention is prepared by polymerization, the polymerization is preferably carried out after applying the composition to the surface of a support such as a liner or coating the surface therewith and forming a sheet by calendering or press molding. As a result, the thermally conductive sheet according to the invention can be obtained. The sheet may be formed in an inert atmosphere of nitrogen or the like in order to prevent inhibition of polymerization by oxygen.

Further, the acrylic-based thermally conductive composition may be produced by adding the thermally conductive filler to a solution of the binder component in a suitable solvent such as ethyl acetate, and heating the contents to remove the solvent while the contents are being sufficiently mixed to effect uniform dispersion of the filler.

When the thermally conductive sheet of the present invention is to be prepared, it can be obtained by applying the molten body or solution to the surface of a support such as a liner or coating the surface therewith, forming a sheet by calendering or press molding and cooling the sheet to solidify or by removing the solvent from the solution by drying.

Applications

The acrylic-based thermally conductive composition and the thermally conductive sheet of the present invention may be used for adhesion of heat sinks or heat radiators to electronic parts, and particularly semiconductor/electronic parts such as power transistors, graphic IC, chip sets, memory chips, central processing units (CPUs) and the like. A thickness of the sheets is mainly determined by considering a thermal resistance of the portions to be applied. Usually, the sheets preferably have a thickness of 5 mm or less because the thermal resistance becomes small. However, when filled into a gap between a larger heat generating part and a heat dissipating part, or applied to conform to irregularities of a part surface, the sheets having a thickness greater than 5 mm may be suitable. When the sheets having a thickness greater than 5 mm are suitable, the thickness of the sheets is preferably less than 10 mm.

The thermally conductive sheet is provided by forming a thermally conductive composition layer on a support or base which is releasable or release treated with respect to the thermally conductive composition. In this case, release of the support or base from the sheet during service will allow the latter to serve as a free-standing film. Alternatively, the thermally conductive sheet may also be used while anchored to the support or base for improved sheet strength. Polymer films are typical as supports or bases, and for example there may be used films of polyethylene, polypropylene, polyimide, polyethylene terephthalate, polyethylene naphthalate, polytetrafluoroethylene, polyether ketone, polyethersulfone, polymethylterpene, polyetherimide, polysulfone, polyphenylene sulfide, polyamidoimide, polyesterimide and aromatic amides. When the heat resistance is particularly required, a polyimide film or polyamidoimide film is preferred. Moreover, the thermal conductivity may also be increased by adding a thermally conductive filler to the support or base. Furthermore, as supports or bases there may be mentioned metal foils of aluminum, copper or the like, or woven fabrics, nonwoven fabrics or scrims formed from glass fibers, carbon fibers, nylon fibers or polyester fibers, or such fibers that have been prepared by coating these fibers with a metal. The support or base may be present on one or both surfaces of the sheet, or it may be embedded in the sheet.

EXAMPLES

Examples 1-11 and Comparative Examples 1-2

1. Production of Partially Polymerized Polymer (Partially Polymerized Polymer 1-2)

An ultraviolet polymerization initiator (Irgacure™ 651 (2,2-dimethoxy-1,2-diphenylethan-1-one), product of Ciba-Specialty Chemical) in an amount of 0.04 part by weight was mixed with 100 parts by weight of 2-ethylhexyl acrylate (2-EHA), and the mixture was exposed to ultraviolet rays at an intensity of 3 mW/cm$^2$ using an ultraviolet light source having a maximum intensity at wavelength of 300-400 nm to give partially polymerized polymer 1 with a viscosity of approximately 1000 centipoise (cP).

An ultraviolet polymerization initiator (Irgacure™ 651) in an amount of 0.04 part by weight and 2-ethylhexyl thioglycolate as a chain transfer agent in an amount of 0.4 parts by weight were mixed with 100 parts by weight of 2-ethylhexyl acrylate (2-EHA), and the mixture was exposed to ultraviolet rays at an intensity of 3 mW/cm$^2$ using an ultraviolet light source having a maximum intensity at wave length of 300-400 nm to give partially polymerized polymer 2 with a viscosity of approximately 1000 centipoise (cP).

2. Fabrication of Thermally Conductive Composition

Thermally conductive composition precursors obtained by deaerating and kneading the components listed in Table 1 below by a mixer were each sandwiched between two polyethylene terephthalate (PET) liners coated with a silicone releasing agent and subjected to calendering. The molding was followed by heating in an oven at 150° C. for 15 minutes for thermal polymerization, to give thermally conductive sheets having a thickness of 1 mm (Examples 1 to 11, and Comparative Example 1).

In Comparative Example 2, the components shown in Table 1 were mixed at temperature of the melting point of the wax (80° C.) or higher. The mixtures were sandwiched between two PET liners, and subjected to calendaring on a hot coater heated to 80° C. to give thermally conductive sheets having a thickness of 1 mm.

In Example 1, the binder component was composed of an 80/20 (weight ratio) copolymer of octadecyl methacrylate (ODMA) (crystalline acrylic monomer) and 2-ethylhexyl acrylate (noncrystalline acrylic monomer).

In Example 2, the binder component was composed of a 90/10 (weight ratio) ODMA and 2-ethylhexyl acrylate.

In Example 3, the binder component was composed of a 90/10 (weight ratio) ODMA and 2-ethylhexyl acrylate, and the copolymer was crosslinked with hexanediol diacrylate.

In Example 4, the binder component was composed of an 80/20 (weight ratio) copolymer of octadecyl acrylate (ODA) (crystalline acrylic monomer) and 2-ethylhexyl acrylate (noncrystalline acrylic monomer).

In Example 5, the binder component was composed of a 50/50 (weight ratio) copolymer of a $C_{18}$-$C_{24}$ alkyl methacrylate mixture (crystalline acrylic monomer) containing behenyl methacrylate (VMA) as a major component and 2-ethylhexyl acrylate.

In Example 6, the binder component was composed of a 55/45 (weight ratio) copolymer of a $C_{18}$-$C_{24}$ alkyl methacrylate mixture (crystalline acrylic monomer) containing behenyl methacrylate (VMA) as a major component and 2-ethylhexyl acrylate (noncrystalline acrylic monomer).

In Example 7, the binder component was composed of an 80/20 (weight ratio) mixture of (a) a 69/31 (weight ratio) copolymer of a $C_{18}$-$C_{24}$ alkyl methacrylate mixture (crystalline acrylic monomer) containing behenyl methacrylate (VMA) as a major component and 2-ethylhexyl acrylate (noncrystalline acrylic monomer) and (b) a low molecular weight polyacrylate (noncrystalline acrylic polymer).

In Example 8, the binder component was composed of an 80/20 (weight ratio) mixture of (a) a 69/31 (weight ratio) copolymer of a $C_{18}$-$C_{24}$ alkyl methacrylate mixture (crystalline acrylic monomer) containing behenyl methacrylate (VMA) as a major component and 2-ethylhexyl acrylate (noncrystalline acrylic monomer) and (b) a low molecular weight polyacrylate (noncrystalline acrylic polymer).

In Example 9, the binder component was composed of an 80/20 (weight ratio) mixture of an octadecyl methacrylate (ODMA) homopolymer (crystalline acrylic polymer) and a low molecular weight polyacrylate (noncrystalline acrylic polymer).

In Example 10, the binder component was composed of a 40/60 (weight ratio) mixture of a poly(octadecyl acrylate) (ODA)) (crystalline acrylic polymer) and a 2-ethyl hexyl acrylate homopolymer (noncrystalline acrylic polymer).

In Example 11, the binder component was composed of a 25/75 (weight ratio) mixture of a poly(octadecyl acrylate (ODA)) (crystalline acrylic polymer) and a 2-ethyl hexyl acrylate homopolymer (noncrystalline acrylic polymer).

In Comparative Example 1, a 2-ethylhexyl acrylate homopolymer was used as the binder component. Further, in Comparative Example 2, paraffin wax and a polyisobutylene were used as the binder component.

3. Measurement of Melting Point

Using a differential scanning calorimeter (product of Perkin Elmer), a sample was heated at a rate of 5° C./min and the endothermic peak temperature is defined as the melting point. The results are shown in Table 1 below.

4. Measurement of Thermal Resistance

After a cut sample in size of 10×11 mm was sandwiched between a heating element and a cooling plate, a difference in temperature between the heating element and the cooling plate was measured when a constant load of 6.9 N/cm² and an electric power of 12.7 W were applied and the thermal resistance was determined by the following equation.

Thermal resistance(degC·cm²/W)=difference in temperature (degC)×area (cm²)/electric power(W)

The results are shown in Table 1.

5. Releasability of Sheet after Service

After measuring the above thermal conductivity, the releasability of a sample from the heating element was examined when the sample temperature recovered to room temperature. The heating element was grasped with one hand, and the cooling plate was grasped with the other hand. Shear force was applied to the heating element and the cooling plate with both hands by twisting, and whether or not the heating element could be removed was examined. The evaluation criteria are as follows: o=the heating element can be released by light twisting; and x=the heating element cannot be released. The results are shown in Table 1.

TABLE 1

| | Example | | | | | | | | | | | Comp. Ex. | |
|---|---|---|---|---|---|---|---|---|---|---|---|---|---|
| | 1 | 2 | 3 | 4 | 5 | 6 | 7 | 8 | 9 | 10 | 11 | 1 | 2 |
| Binder component (wt. parts) | | | | | | | | | | | | | |
| Partially polymerized polymer 1 | 20 | 10 | 10 | — | 50 | 45 | 25 | — | — | 20 | 30 | 65 | — |
| Partially polymerized polymer 2 | — | — | — | 20 | — | — | — | 25 | — | — | — | — | — |
| ODA | — | — | — | 80 | — | — | — | — | — | — | — | — | — |
| ODMA | 80 | 90 | 90 | — | — | — | — | — | 80 | — | — | — | — |
| VMA-70 | — | — | — | — | 50 | 55 | 55 | 55 | — | — | — | — | — |
| 2-EHA | — | — | — | — | — | — | — | — | — | 40 | 45 | 35 | — |
| UP1000 | — | — | — | — | — | — | 20 | 20 | 20 | — | — | — | — |
| Poly(ODA) | — | — | — | — | — | — | — | — | — | 40 | 25 | — | — |
| Paraffin wax | — | — | — | — | — | — | — | — | — | — | — | — | 75 |
| Polyisobutylene | — | — | — | — | — | — | — | — | — | — | — | — | 25 |
| HDDA | — | — | 0.2 | — | — | — | — | — | — | — | — | 0.15 | — |
| Irganox 1076 | 0.3 | 0.3 | 0.3 | 0.3 | 0.3 | 0.3 | 0.3 | 0.3 | 0.3 | 0.3 | 0.3 | 0.3 | — |
| LPO | 0.25 | 0.25 | 0.25 | 0.25 | 0.25 | 0.25 | 0.25 | 0.25 | 0.25 | 0.25 | 0.25 | 0.25 | — |
| BPTC | 0.5 | 0.5 | 0.5 | 0.5 | 0.5 | 0.5 | 0.5 | 0.5 | 0.5 | 0.5 | 0.5 | 0.5 | — |
| Thermally conductive composition | | | | | | | | | | | | | |

TABLE 1-continued

| | Example | | | | | | | | | | | Comp. Ex. | |
|---|---|---|---|---|---|---|---|---|---|---|---|---|---|
| | 1 | 2 | 3 | 4 | 5 | 6 | 7 | 8 | 9 | 10 | 11 | 1 | 2 |
| (volume parts) | | | | | | | | | | | | | |
| Binder component mentioned above | 40 | 40 | 40 | 40 | 40 | 40 | 40 | 40 | 40 | 40 | 40 | 40 | 40 |
| Total filler amount | 60 | 60 | 60 | 60 | 60 | 60 | 60 | 60 | 60 | 60 | 60 | 60 | 60 |
| Silicon carbide | 40 | 40 | 40 | 40 | 40 | 40 | 40 | 40 | 40 | 40 | 40 | 40 | 40 |
| Aluminum hydroxide | 20 | 20 | 20 | 20 | 20 | 20 | 20 | 20 | 20 | 20 | 20 | 20 | 20 |
| Melting point (deg C.) | 28 | 32 | 29 | 43 | 33 | 36 | 40 | 45 | 35 | 41 | 41 | — | 53 |
| Thermal resistance after service (deg C. · cm$^2$/W) | 3.98 | 4.23 | 5.42 | 4.08 | 4.99 | 4.54 | 3.26 | 3.71 | 2.32 | 3.74 | 4.42 | 5.55 | 4.43 |
| Releasability after service | ○ | ○ | ○ | ○ | ○ | ○ | ○ | ○ | ○ | ○ | ○ | ○ | x |

The results are in the above table wherein ODA is octadecyl acrylate, ODMA is octadecyl methacrylate, VMA-70 is a mixture of alkyl methacrylates of 18 to 24 carbons having behenyl methacrylate with 22 carbons as the major component (content of 70%) (product of Nihon Yushi Co., Ltd.), 2-EHA is 2-ethylhexyl acrylate, UP-1000 is liquid low molecular weight polyacrylate (noncrystalline acrylic polymer) having a molecular weight of 3000 and a Tg of −55° C. (product of TOAGOSEI Co., Ltd.), poly(ODA) is a polyoctadecyl acrylate (product of Scientific Polymer Products), the paraffin wax has a melting point of 56° C., polyisobutylene has a molecular weight of 4000, HDDA is 1,6-hexanediol diacrylate, Irganox 1076 is an antioxidant (product of Ciba-Specialty Chemical), LPO is lauroyl peroxide, and BPTC is 1,1-bis(t-butylperoxy)-3,3,5-trimethylcyclohexane, the silicon carbide had an average particle size of 70 μm, and the aluminum hydroxide had an average particle size of 2 μm and was titanate-treated.

From Table 1, one can conclude that the thermally conductive sheets of the present invention in Examples 1 to 11 showed low thermal resistances and good releasability after service. On the other hand, the thermally conductive sheet in Comparative Example 1 in which an acrylic polymer containing no crystalline acrylic polymer was used as a binder component showed a high thermal resistance. Moreover, the thermal conductive sheet in Comparative Example 2 in which wax was used as a binder component could not be released after service.

Examples 12 and Comparative Example 3

Preparation of Thermally Conductive Compositions and Measurement of Physical Properties A thermally conductive composition precursor obtained by deaerating and kneading the component with a composition listed in Table 2 below by a mixer was sandwiched between two PET liners coated with a silicone releasing agent and subjected to calendering. The molding was followed by exposing the calendered sheet to ultraviolet light at an intensity of 3 mW/cm$^2$ for 5 minutes for ultraviolet polymerization to give a thermally conductive sheet having a thickness of 0.12 mm (Example 12).

In Comparative Example 3, the component shown in Table 2 was mixed at temperatures of the melting point of the wax (90° C.) or higher. The mixture was sandwiched between two PET liners, and subjected to calendaring on a hot coater heated to 90° C. to give a thermally conductive sheet having a thickness of 0.12 mm.

Moreover, measurements of melting points, thermal resistances and releasability after service were carried out in the same manner as described above.

TABLE 2

| | Example 12 | Comparative Example 3 |
|---|---|---|
| Binder component (wt. Parts) | | |
| Partially polymerized polymer 1 | 40 | — |
| 2-EHA | — | — |
| ODA | 60 | — |
| Irgacure 651 (ultraviolet polymerization initiator) | 0.2 | — |
| Paraffin wax | — | 75 |
| Polyisobutylene | — | 25 |
| Thermally conductive composition (vol. parts) | | |
| Binder component mentioned above | 85 | 85 |
| Boron nitride | 15 | 15 |
| Melting point (deg C.) | 29 | 53 |
| Thermal resistance (deg C. · cm$^2$/W) | 2.28 | 2.68 |
| Releasability after service | ○ | x |

Irgacure 651 (product of Ciba-Specialty Chemical) was used as an ultraviolet polymerization initiator. Boron nitride had an average particle size of 10 μm. The other components are the same as in Table 1.

From Table 2, one can conclude that the thermally conductive sheet of the present invention in Example 12 showed a low thermal resistance and good releasability after service. On the other hand, the thermally conductive sheet in Comparative Example 3 in which wax was used as a binder component could not be released after service.

The acrylic-based thermally conductive composition and the thermally conductive sheet of the present invention show high thermal conductivities during service and adhesion to bodies with which they are contacted are enhanced, and they exhibit good releasability after service.

The invention claimed is:
1. An acrylic thermally conductive composition comprising:
a thermally conductive filler; and a crystalline aliphatic acrylic polymer comprising from 55 to 80 wt % of a homopolymer or copolymer of one or more (meth)acrylate ester monomers containing an alkyl group of 18 or more carbon atoms and further comprises a homopolymer or copolymer of one or more (meth)acrylic monomers wherein the (meth)acrylic monomers contain an alkyl group of 12 carbons or less.

2. A composition according to claim 1 wherein the (meth)acrylate ester monomers are selected from octadecyl (meth)acrylate, nonadecyl(meth)acrylate, icosanyl(meth)acrylate, henicosanyl(meth)acrylate, docosanyl(meth)acrylate, tricosanyl(meth)acrylate, tetracosanyl(meth)acrylate, octadodecyl(meth)acrylate, and combinations thereof.

3. A composition according to claim 1 wherein (meth)acrylic monomers are selected from ethyl (meth)acrylate, butyl (meth)acrylate, hexyl (meth)acrylate, 2-ethylhexyl (meth)acrylate, octyl (meth)acrylate, isooctyl (meth)acrylate, decyl (meth)acrylate, dodecyl (meth)acrylate, and combinations thereof.

4. A composition according to claim 1 wherein the crystalline acrylic polymer has a melting point of 25° C. or higher and 100° C. or lower.

5. A thermally conductive sheet obtained from a composition according to claim 1.

6. A laminate comprising:
an electronic part;
a thermally conductive sheet obtained from a composition according to claim 1 having a first side and a second side, wherein the first side is in contact with the electronic part; and
a heat sink or heat radiator in contact with the second side of the thermally conductive sheet.

7. A laminate according to claim 6 wherein the electronic part is selected from a power transistor, a graphic IC, chip sets, memory chips, central processing units, and combinations thereof.

8. A laminate according to claim 6 wherein the thickness of the thermally conductive sheet is less than 10 mm.

9. A laminate according to claim 8 wherein the thickness of the thermally conductive sheet is less than 5 mm.

* * * * *

UNITED STATES PATENT AND TRADEMARK OFFICE
CERTIFICATE OF CORRECTION

| | | |
|---|---|---|
| PATENT NO. | : 7,527,753 B2 | Page 1 of 1 |
| APPLICATION NO. | : 10/551593 | |
| DATED | : May 5, 2009 | |
| INVENTOR(S) | : Yuji Hiroshige | |

It is certified that error appears in the above-identified patent and that said Letters Patent is hereby corrected as shown below:

Column 10,
Line 25, delete "(degC·cm$^2$/W)" and insert --(degC.·cm$^2$/W)-- therefor.

Line 26, delete "(degC)" and insert --(degC.)-- therefor.

Column 13,
Lines 12-13, Claim 2, delete "octadodecyl(meth)acrylate," and insert --octyldodecyl(meth)acrylate,-- therefor.

Signed and Sealed this

Seventeenth Day of August, 2010

David J. Kappos
*Director of the United States Patent and Trademark Office*